United States Patent
Noguchi et al.

(10) Patent No.: US 11,887,764 B2
(45) Date of Patent: Jan. 30, 2024

(54) LAMINATED ELECTRONIC COMPONENT

(71) Applicant: Murata Manufacturing Co., Ltd., Kyoto-fu (JP)

(72) Inventors: Yutaka Noguchi, Nagaokakyo (JP); Takeshi Kobayashi, Nagaokakyo (JP); Makoto Yamamoto, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 162 days.

(21) Appl. No.: 17/178,160

(22) Filed: Feb. 17, 2021

(65) Prior Publication Data

US 2021/0174997 A1 Jun. 10, 2021

Related U.S. Application Data

(62) Division of application No. 15/711,388, filed on Sep. 21, 2017, now Pat. No. 10,937,583.

(30) Foreign Application Priority Data

Sep. 26, 2016 (JP) .................................. 2016-187242

(51) Int. Cl.
*H01F 27/28* (2006.01)
*H01F 17/00* (2006.01)
(Continued)

(52) U.S. Cl.
CPC ......... *H01F 17/0013* (2013.01); *H01F 17/04* (2013.01); *H01F 27/29* (2013.01);
(Continued)

(58) Field of Classification Search
CPC ...... H01F 17/0013; H01F 17/04; H01F 27/29; H01F 17/0033; H01F 2017/004;
(Continued)

(56) References Cited

U.S. PATENT DOCUMENTS

| 2011/0285494 A1* | 11/2011 | Jeong | ................... H01F 17/0013 |
| | | | 336/200 |
| 2017/0018351 A1* | 1/2017 | Yatabe | ................. H01F 27/2804 |
| 2018/0041185 A1* | 2/2018 | Omori | .................. H01F 17/0013 |

FOREIGN PATENT DOCUMENTS

| JP | S62-029886 A | 2/1987 |
| JP | H0684687 A | 3/1994 |

(Continued)

OTHER PUBLICATIONS

An Office Action; "Notification of Reasons for Refusal," mailed by the Japanese Patent Office dated Mar. 5, 2019, which corresponds to Japanese Patent Application No. 2016-187242 and is related to U.S. Appl. No. 15/711,388; with English language translation.

(Continued)

*Primary Examiner* — Shawki S Ismail
*Assistant Examiner* — Kazi S Hossain
(74) *Attorney, Agent, or Firm* — Studebaker & Brackett PC

(57) ABSTRACT

A laminated electronic component having a coil formed in the laminated body of pluralities of laminated magnetic material layers and conductor patterns by electrically connecting the conductor patterns adjacent to each other via the magnetic material layers. The magnetic material layers contain a metal magnetic material. The coil has a first end portion close to a bottom surface of the laminated body and a second end portion distant from the bottom surface of the laminated body. The first end portion is electrically connected to a first external terminal disposed on the bottom surface of the laminated body. The second end portion is electrically connected to a second external terminal disposed on the bottom surface of the laminated body via an electrode disposed on a side surface of the laminated body. The electrode is covered with an insulator film.

14 Claims, 9 Drawing Sheets

(51) Int. Cl.
*H01F 17/04* (2006.01)
*H01F 27/29* (2006.01)
*H01L 23/522* (2006.01)
*H05K 3/46* (2006.01)

(52) U.S. Cl.
CPC ...... *H01L 23/5227* (2013.01); *H01F 17/0033* (2013.01); *H01F 2017/004* (2013.01); *H05K 3/4629* (2013.01)

(58) Field of Classification Search
CPC ......... H01F 27/2847; H01F 2017/0066; H01F 2027/2809; H01F 27/292; H01F 27/306; H01F 27/32; H01L 23/5227; H05K 3/4629
USPC .................................. 336/200, 232, 192, 83
See application file for complete search history.

(56) References Cited

FOREIGN PATENT DOCUMENTS

| | | | |
|---|---|---|---|
| JP | H0799119 A | 4/1995 | |
| JP | 2007-012920 A | 1/2007 | |
| JP | 2012-256758 A | 12/2012 | |
| JP | 2013-045985 A | 3/2013 | |
| JP | 5190331 B2 | 4/2013 | |
| JP | 2013-098281 A | 5/2013 | |
| JP | 2016012728 A | * | 1/2016 |
| JP | 2016012728 A | 1/2016 | |
| JP | 2016-111280 A | 6/2016 | |
| JP | 2016-186963 A | 10/2016 | |
| KR | 10-2014-0038539 A | 3/2014 | |

OTHER PUBLICATIONS

An Office Action mailed by the Korean Patent Office dated Oct. 10, 2018, which corresponds to Korean Patent Application 10-2017-0122621 and is related to U.S. Appl. No. 15/711,388 with English language Translation.

* cited by examiner 85  86

LAMINATED ELECTRONIC COMPONENT

CROSS-REFERENCE TO RELATED APPLICATIONS

This application is a Divisional of U.S. patent application Ser. No. 15/711,388 filed on Sep. 21, 2017, which claims priority to Japanese Patent Application No. 2016-187242, filed on Sep. 26, 2016, the disclosure of which is hereby incorporated by reference in its entirety.

TECHNICAL FIELD

The present disclosure relates to a laminated electronic component having a coil formed in a laminated body.

BACKGROUND

As shown in FIGS. 6 and 7, conventional laminated electronic components include a component having a coil formed in a laminated body by laminating magnetic material layers 61A to 61F and conductor patterns 62A to 62E and by spirally connecting the conductor patterns 62A to 62E between the magnetic material layers with lead-out ends of the coil led out to longitudinal-direction side surfaces of the laminated body so that the coil is connected between external terminals 65, 66 formed on the longitudinal-direction side surfaces of the laminated body and four surfaces adjacent to these side surfaces.

In recent years, because of miniaturization and higher functionality of mobile devices on which this kind of electronic components is mounted, the number of electronic circuits required for these devices has increased and an area of a mounting board has become smaller. Accordingly, electronic components used for these devices are required to be reduced in size and thickness. Additionally, lower voltages are increasingly used in these devices, so that inductors used in these devices are required to be further improved in DC superposition characteristics. Furthermore, minimization of land patterns for mounting and minimization of distance between adjacent electronic components are performed on mounting boards of these devices so as to mount the electronic components at higher density, and inductors to be mounted on the mounting boards of these devices must be mounted at high density.

One method of improving DC superimposition characteristics of an inductor is to use a material with a high maximum magnetic flux density for a magnetic material constituting an element body of the inductor. Although the conventional laminated electronic components typically have a laminated body made of ferrite, the maximum magnetic flux density of ferrite is as low as about 0.4 T. Therefore, the conventional laminated electronic components have a problem that magnetic saturation easily occurs when a large current is applied. To solve such a problem, the material of the laminated body is switched from ferrite to a metal magnetic material having a high saturation magnetic flux density so as to improve the DC superimposition characteristics (see, e.g., Japanese Laid-Open Patent Publication No. 2013-45985).

However, a metal magnetic material has a lower volume resistivity of material and a lower withstand voltage as compared to ferrite. Therefore, to ensure the insulation and the withstand voltage of the inductor in the conventional laminated electronic components, it is necessary to ensure a sufficient distance between external terminals and to ensure a sufficient distance between positions causing a potential difference, so that it is difficult to achieve sufficient miniaturization. To solve such a problem, the volume resistivity and the withstand voltage are improved by covering a surface of a laminated body having a coil formed therein with ceramics etc. having a high withstand voltage (see, e.g., Japanese Patent No. 5190331).

The conventional laminated electronic components have external terminals formed on the longitudinal-direction side surfaces of the laminated body and four surfaces adjacent to these side surfaces and therefore have a problem that a solder bridge is formed between the external terminals of adjacent electronic components due to a solder fillet at the time of mounting and soldering on a mounting board, a positional displacement of a mounting position at the time of mounting on the mounting board, etc., causing a short circuit. Therefore, it is difficult to mount the electronic components on a mounting board on which the components are mounted at a high density as described above. To solve such a problem, a laminated electronic component having external terminals formed on the longitudinal-direction side surfaces of the laminated body and four surfaces adjacent to these side surfaces is covered with an insulator film except a bottom surface (see, e.g., Japanese Laid-Open Patent Publication No. 2012-256758).

On the other hand, as shown in FIGS. 8 and 9, magnetic material layers 81A to 81E are provided with conductor patterns 82A to 82E and conductors 83, 84 penetrating the magnetic material layers, and a coil is formed in a laminated body by laminating the magnetic material layers 81A to 81F and the conductor patterns 82A to 82E and by spirally connecting the conductor patterns 82A to 82E between the magnetic material layers in the laminated body provided with the conductors 83, 84 such that both ends of the coil are led out by the conductors 83, 84 to a bottom surface of the laminated body and connected to external terminals 85, 86 formed on the bottom surface of the laminated body (see, e.g., Japanese Examined Patent Application Publication No. 62-29886).

SUMMARY

The present disclosure provides a laminated electronic component having a coil formed in a laminated body of pluralities of alternately laminated magnetic material layers and conductor patterns by electrically connecting the conductor patterns adjacent to each other via the magnetic material layers. The magnetic material layers contain a metal magnetic material. The coil has a first end portion close to a bottom surface of the laminated body and a second end portion distant from the bottom surface of the laminated body. The first end portion is electrically connected to a first external terminal disposed on the bottom surface of the laminated body. The second end portion is electrically connected to a second external terminal disposed on the bottom surface of the laminated body via an electrode disposed on a side surface of the laminated body. The electrode is covered with an insulator film.

DETAILED DESCRIPTION

Figure 1:
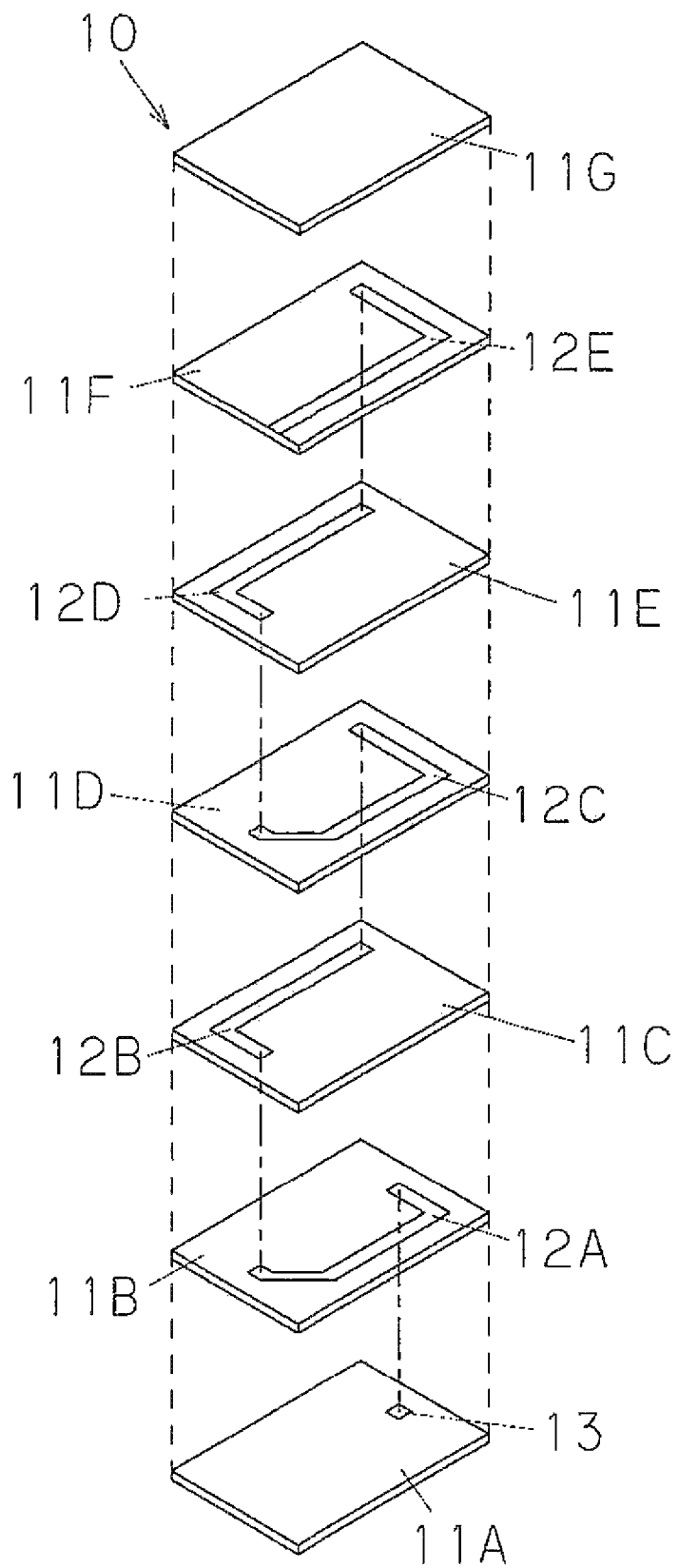
FIG. 1 is an exploded perspective view of a first embodiment of a laminated electronic component of the present disclosure.

However, in the laminated electronic component described in Japanese Laid-Open Patent Publication No. 2012-256758, since the thickness of the insulator film is added to the element dimension, the shape of the laminated body must be made smaller by the thickness of the insulator film, and the component has a problem that the desired inductance and DC superimposition characteristics are difficult to ensure. In the laminated electronic component described in Japanese Examined Patent Application Publication No. 62-29886, a sufficient distance must be ensured between the coil and the conductors so as to ensure insulation and withstand voltage in the laminated body, and the component has a problem that the desired inductance and DC superimposition characteristics are difficult to ensure. Furthermore, since such a conventional laminated electronic component has the conductors disposed in the laminated body such that both ends of the coil are connected to the external electrodes, it is difficult to ensure a sufficient magnetic flux passing area in the laminated body as compared to the conventional laminated electronic component shown in FIGS. 6 and 7, and the component has a problem that a desired inductance is not acquired or, even if the desired inductance is acquired, it is difficult to ensure the DC superimposition characteristics without increasing the resistance value of the coil.

It is an object of the present disclosure to solve these problems and to provide a laminated electronic component using a metal magnetic material, having excellent DC superimposition characteristics and higher insulation and withstand voltage characteristics, and suitable for high-density mounting.

The present disclosure provides a laminated electronic component having a coil formed in a laminated body by laminating pluralities of magnetic material layers and conductor patterns and by connecting the conductor patterns between the magnetic material layers. The magnetic material layers are made of a metal magnetic material. The coil has a lead-out end (first end portion) close to a bottom surface of the laminated body led out to the bottom surface of the laminated body and a lead-out end (second end portion) distant from the bottom surface of the laminated body led out to a side surface of the laminated body. The first end portion is connected to a first external terminal disposed on the bottom surface of the laminated body. The second end portion is connected to a second external terminal disposed on the bottom surface of the laminated body via an electrode disposed on the side surface of the laminated body. The electrode disposed on the side surface of the laminated body is covered with an insulator film.

In other words, the present disclosure provides a laminated electronic component which includes a coil and a laminated body. The coil is formed in the laminated body of pluralities of alternately laminated magnetic material layers and conductor patterns by electrically connecting the conductor patterns adjacent to each other via the magnetic material layers. The magnetic material layers contain a metal magnetic material, wherein the coil has a first end portion close to a bottom surface of the laminated body and a second end portion distant from the bottom surface of the laminated body. The first end portion is electrically connected to a first external terminal disposed on the bottom surface of the laminated body. The second end portion is electrically connected to a second external terminal disposed on the bottom surface of the laminated body via an electrode disposed on a side surface of the laminated body. The electrode is covered with an insulator film.

The present disclosure also provides a laminated electronic component having a coil formed in a laminated body by laminating pluralities of magnetic material layers and conductor patterns and by connecting the conductor patterns between the magnetic material layers. The magnetic material layers are made of a metal magnetic material. The coil has a lead-out end (first end portion) close to a bottom surface of the laminated body led out to the bottom surface of the laminated body and a lead-out end (second end portion) distant from the bottom surface of the laminated body led out to a side surface of the laminated body. The lead-out end (first end portion) of the coil close to the bottom surface of the laminated body is connected to a first external terminal formed on the bottom surface of the laminated body. The lead-out end (second end portion) of the coil distant from the bottom surface of the laminated body is connected to a second external terminal formed on the bottom surface of the laminated body via a conductor having a surface partially exposed on the side surface of the laminated body. The conductor exposed on the side surface of the laminated body is covered with an insulator film.

In other words, the present disclosure also provides a laminated electronic component including a coil and a laminated body. The coil is formed in the laminated body of pluralities of alternately laminated magnetic material layers and conductor patterns by electrically connecting the conductor patterns adjacent to each other via the magnetic material layers. The magnetic material layers contain a metal magnetic material, wherein the first end portion is connected to a first external terminal disposed on a bottom surface of the laminated body. The second end portion is connected to a second external terminal disposed on the bottom surface of the laminated body via a conductor embedded in a side surface of the laminated body with a surface thereof partially exposed. The exposed surface of the conductor is covered with an insulator film.

The laminated electronic component of the present disclosure has a coil formed in a laminated body by laminating magnetic material layers and conductor patterns and by connecting the conductor patterns between the magnetic material layers. The magnetic material layers are made of a metal magnetic material. The coil has a first end portion led out to a bottom surface of the laminated body and a second end portion led out to a side surface of the laminated body. The first end portion is connected to a first external terminal formed on the bottom surface of the laminated body. The second end portion of the coil is connected to a second external terminal formed on the bottom surface of the laminated body via an electrode formed on the side surface of the laminated body. The electrode formed on the side surface of the laminated body is covered with an insulator film. Therefore, the laminated electronic component has excellent DC superimposition characteristics and high insulation and withstand voltage characteristics and can be mounted at high density on a mounting board.

The laminated electronic component of the present disclosure has a coil formed in a laminated body by laminating magnetic material layers and conductor patterns and by connecting the conductor patterns between the magnetic material layers. The magnetic material layers are made of a metal magnetic material. The coil has a first end portion led out to a bottom surface of the laminated body and a second end portion led out to a side surface of the laminated body. The first end portion of the coil is connected to a first external terminal formed on the bottom surface of the laminated body. The second end portion of the coil is connected to a second external terminal formed on the bottom surface of the laminated body via a conductor having a surface partially exposed on the side surface of the laminated body. The conductor exposed on the side surface of the laminated body is covered with an insulator film. Therefore, the laminated electronic component has excellent DC superimposition characteristics and high insulation and withstand voltage characteristics and can be mounted at high density on a mounting board.

A laminated electronic component of the present disclosure has a coil formed in a laminated body by laminating magnetic material layers made of a metal magnetic material and conductor patterns and by connecting the conductor patterns between the magnetic material layers. The laminated body has a bottom surface orthogonal to a lamination direction and having an external terminal disposed thereon and a side surface adjacent to the bottom surface and parallel to the lamination direction. In the coil, a lead-out end (first end portion) close to the bottom surface of the laminated body is led out to the bottom surface of the laminated body, and a lead-out end (second end portion) distant from the bottom surface of the laminated body is led out to the side surface of the laminated body. The lead-out end of the coil close to the bottom surface of the laminated body is connected to a first external terminal formed on the bottom surface of the laminated body, and the lead-out end of the coil distant from the bottom surface of the laminated body is connected to a second external terminal formed on the bottom surface of the laminated body via an electrode formed on the side surface of the laminated body or a conductor embedded in the side surface with a surface thereof partially exposed on the side surface of the laminated body. The electrode formed on the side surface of the laminated body or the conductor having the surface partially exposed on the side surface of the laminated body is covered with an insulator film.

Therefore, the laminated electronic component of the present disclosure has no external terminal on the side surface of the laminated body, so that no solder fillet is formed on the side surface at the time of soldering to a mounting board.

Figure 8:
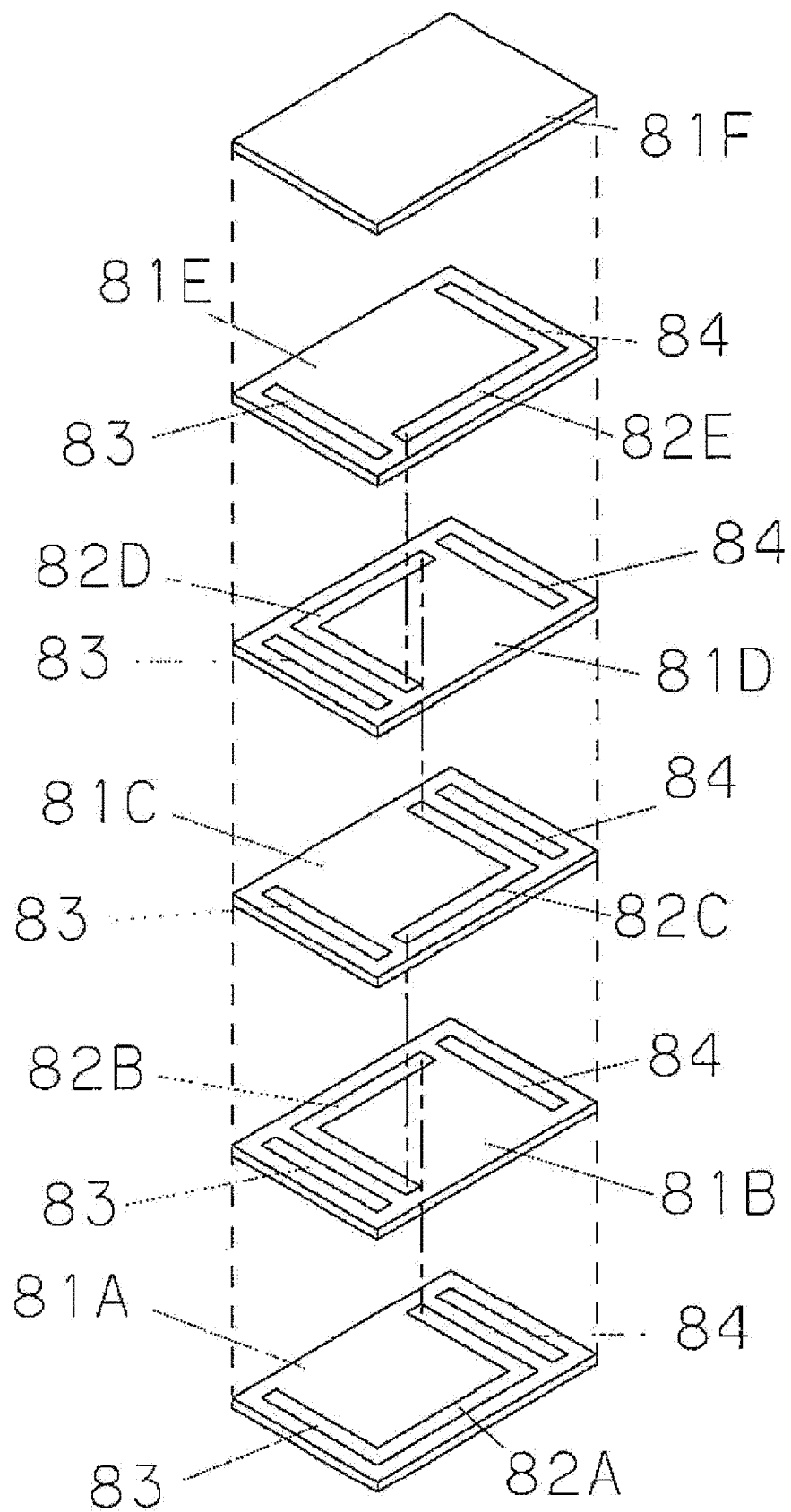
FIG. 8 is an exploded perspective view of another conventional laminated electronic component.
Figure 9:
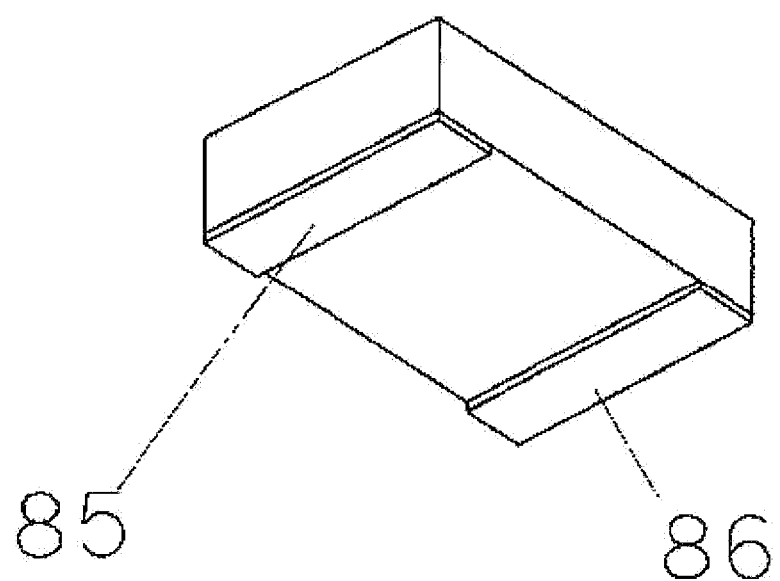
FIG. 9 is a perspective view of the other conventional laminated electronic component.

In the laminated electronic component of the present disclosure, the distance between positions causing a potential difference and the magnetic flux passing area in the laminated body can be made larger than those of the conventional laminated electronic component shown in FIGS. 8 and 9.

Figure 6:
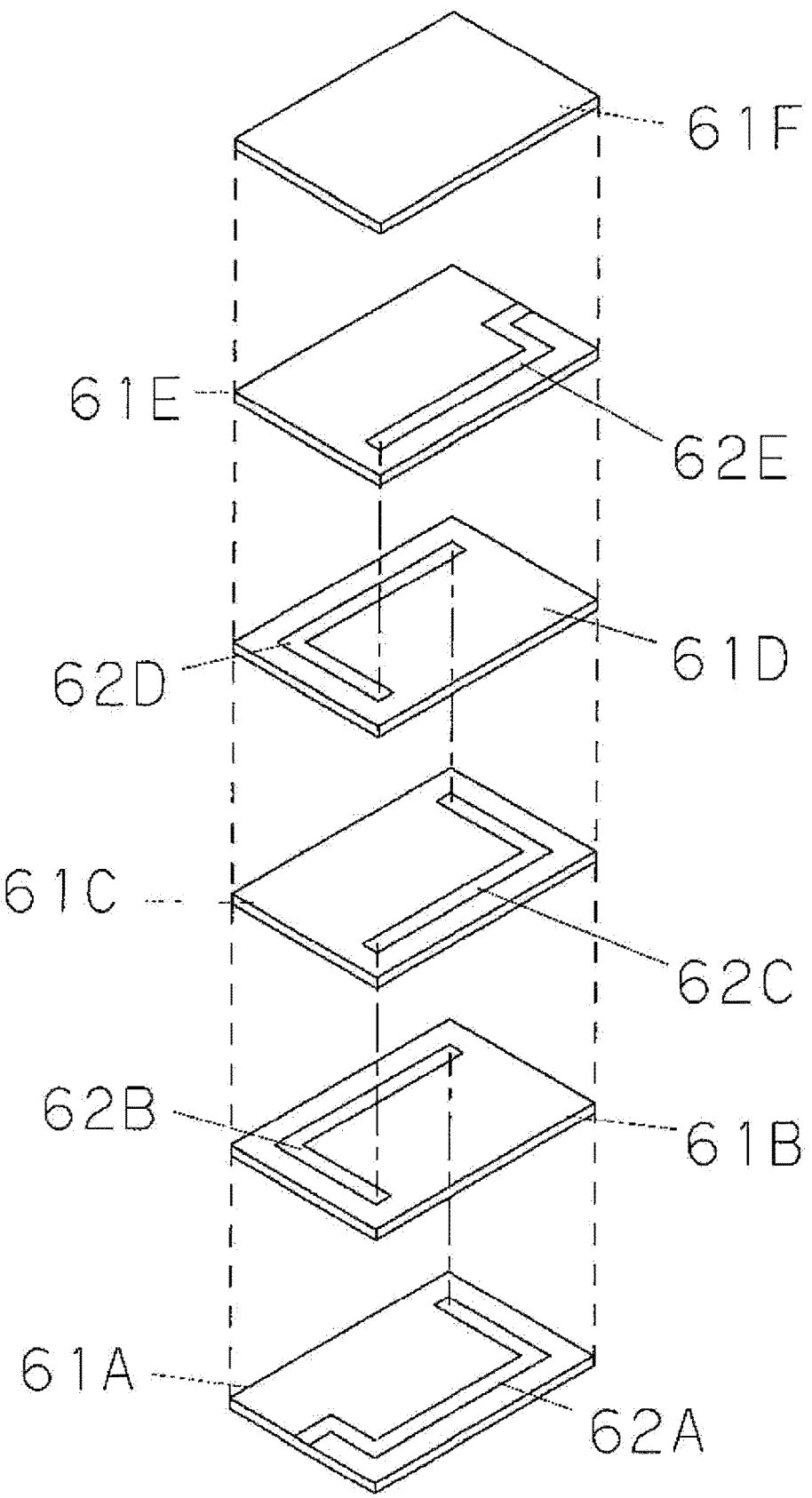
FIG. 6 is an exploded perspective view of a conventional laminated electronic component.
Figure 7:
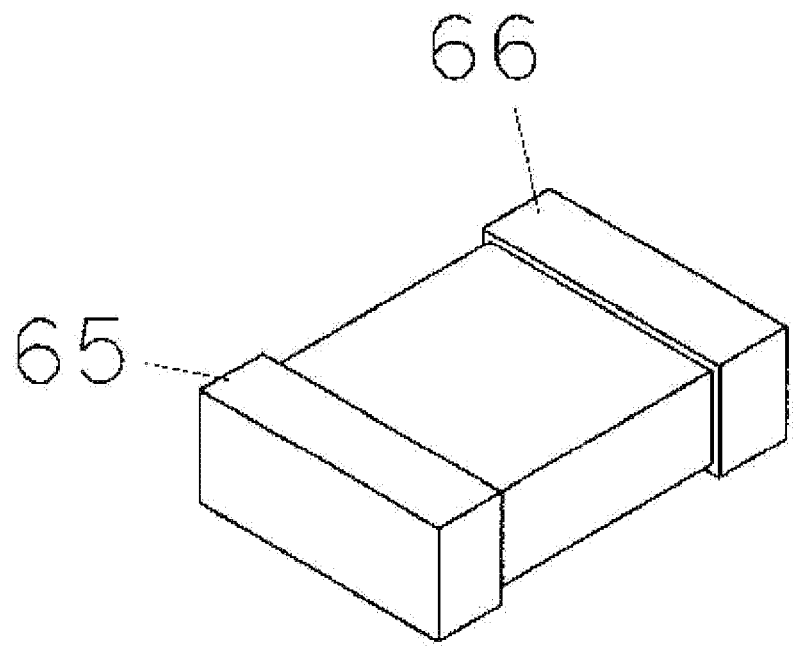
FIG. 7 is a perspective view of the conventional laminated electronic component.

Furthermore, since the laminated electronic component of the present disclosure has no external terminal formed on the side surface, the volume of the laminated body can be made larger than that of the conventional laminated electronic component shown in FIGS. 6 and 7 by the volume of the external terminal and the insulator film on the side surface, which reduces the magnetic flux density per unit volume, so that the characteristics can be improved.

Additionally, the laminated electronic component may have an insulator part between the coil and the conductor. By providing the insulator part, better and higher insulation and withstand voltage characteristics can be achieved.

EMBODIMENTS

Embodiments of the laminated electronic component of the present disclosure will now be described with reference to FIGS. 1 to 5.

FIG. 1 is an exploded perspective view of a first embodiment of the laminated electronic component of the present disclosure.

In FIG. 1, reference numerals 10, 11A to 11G, and 12A to 12E denote a laminated body, magnetic material layers, and conductor patterns, respectively.

The laminated body 10 is formed by laminating the magnetic material layers 11A to 11G formed into a rectangular shape and the conductor patterns 12A to 12E. The laminated body 10 has a bottom surface orthogonal to a lamination direction and having an external terminal disposed thereon, and four side surfaces adjacent to the bottom surface and parallel to the lamination direction. The four side surfaces are two longitudinal-direction side surfaces perpendicular to the longitudinal direction of the rectangular magnetic material layers and two lateral-direction side surfaces parallel to the longitudinal direction of the magnetic material layers. The magnetic material layers 11A to 11G are made of a metal magnetic material such as metal magnetic powder of Fe, Si, Fe—Si—Cr, Fe—Si—Al, Fe—Ni—Al, Fe—Cr—Al, amorphous, etc. The conductor patterns 12A to 12E are made of a conductor paste that is a metal material such as silver, silver-based material, gold, gold-based material, copper, copper-based material, etc. made into a paste form.

The magnetic material layer 11A is formed into a rectangular sheet shape and has a through-hole formed at a position corresponding to one end of the conductor pattern 12A described later. A conductor 13 having the same thickness as the magnetic material layer 11A is formed in the through-hole of the magnetic material layer 11A. The conductor 13 is formed by printing using the same material as the material forming the conductor patterns described later.

The magnetic material layer 11B is formed into a rectangular sheet shape and has a through-hole formed at a position corresponding to one end of the conductor pattern 12A formed on an upper surface that is the surface on the side opposite to the bottom surface of the laminated body 10. In the through-hole, a conductor having the same thickness as the magnetic material layer 11B is formed by printing using the same material as the material forming the conductor pattern 12A. The conductor pattern 12A is formed for less than one turn and has one end connected to the conductor 13 via the conductor in the through-hole formed in the magnetic material layer 11B.

The magnetic material layer 11C is formed into a rectangular sheet shape and has a through-hole formed at a position corresponding to one end of the conductor pattern 12B formed on the upper surface. In the through-hole, a conductor having the same thickness as the magnetic material layer 11C is formed by printing using the same material as the material forming the conductor pattern 12B. The conductor pattern 12B is formed for less than one turn and has one end connected to the other end of the conductor pattern 12A via the conductor in the through-hole formed in the magnetic material layer 11C.

The magnetic material layer 11D is formed into a rectangular sheet shape and has a through-hole formed at a position corresponding to one end of the conductor pattern 12C formed on the upper surface. In the through-hole, a conductor having the same thickness as the magnetic material layer 11D is formed by printing using the same material as the material forming the conductor pattern 12C. The conductor pattern 12C is formed for less than one turn and has one end connected to the other end of the conductor pattern 12B via the conductor in the through-hole formed in the magnetic material layer 11D.

The magnetic material layer 11E is formed into a rectangular sheet shape and has a through-hole formed at a position corresponding to one end of the conductor pattern 12D formed on the upper surface. In the through-hole, a conductor having the same thickness as the magnetic material layer 11E is formed by printing using the same material as the material forming the conductor pattern 12D. The conductor pattern 12D is formed for less than one turn and has one end connected to the other end of the conductor pattern 12C via the conductor in the through-hole formed in the magnetic material layer 11E.

The magnetic material layer 11F is formed into a rectangular sheet shape and has a through-hole formed at a position corresponding to one end of the conductor pattern 12E formed on the upper surface. In the through-hole, a conductor having the same thickness as the magnetic material layer 11F is formed by printing using the same material as the material forming the conductor pattern 12E. The conductor pattern 12E is formed for less than one turn and has one end connected to the other end of the conductor pattern 12D via the conductor in the through-hole formed in the magnetic material layer 11F and the other end led out to the longitudinal-direction side surface.

The magnetic material layer 11G for protecting the conductor pattern is formed on the magnetic material layer 11F having the conductor pattern 12E formed thereon.

Figure 2:
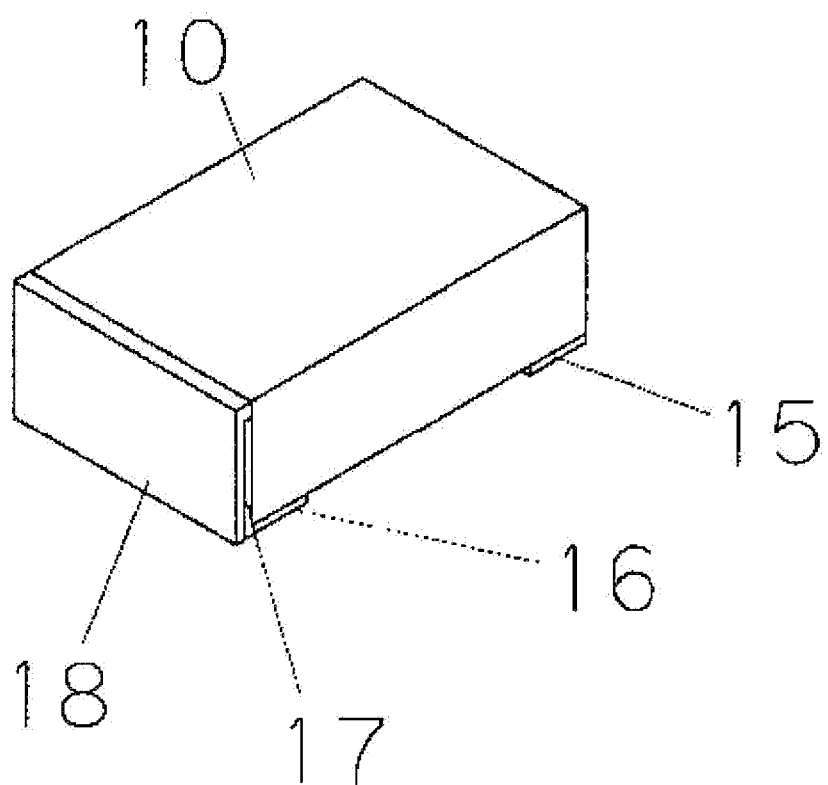
FIG. 2 is a perspective view of the first embodiment of the laminated electronic component of the present disclosure.

By spirally connecting the conductor patterns 12A to 12E between the magnetic material layers in this way, a coil pattern is formed in the laminated body. In this coil pattern, a lead-out end (first end portion) close to the bottom surface of the laminated body 10 is connected to the conductor 13 and exposed on the bottom surface of the laminated body 10, and a lead-out end (second end portion) of the coil pattern distant from the bottom surface of the laminated body 10 is exposed on the longitudinal-direction side surface of the laminated body 10. As shown in FIG. 2, a first external terminal 15 and a second external terminal 16 are formed on the bottom surface of the laminated body 10, and an electrode 17 connected to the second external terminal 16 is formed on the longitudinal-direction side surface on which the lead-out end (second end portion) of the coil pattern is exposed. The electrode 17 is covered with an insulator film 18 formed on the longitudinal-direction side surface of the laminated body 10. The insulator film 18 is made of an insulating material, for example, a dielectric material such as glass and glass ceramics, a magnetic material such as ferrite, or a nonmagnetic material, and is particularly made of a material higher in volume resistivity and withstand voltage than the material constituting the laminated body 10.

The first end portion of the coil is connected to the first external terminal 15 via the conductor 13 and the second end portion of the coil is connected to the second external portion 16 via the electrode 17 formed on the longitudinal-direction side surface of the laminated body 10, so that the coil is connected between the first external terminal 15 and the second external terminal 16.

Figure 3:
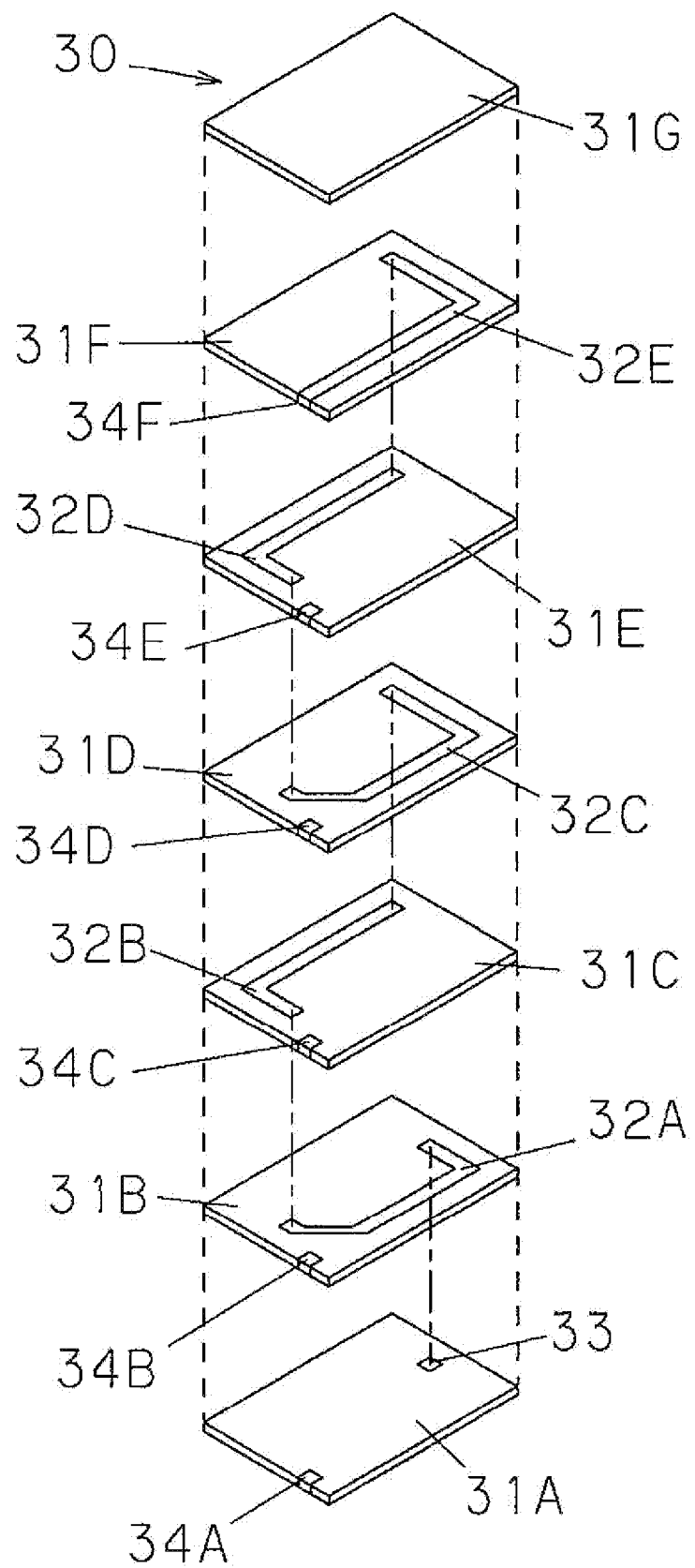
FIG. 3 is an exploded perspective view of a second embodiment of the laminated electronic component of the present disclosure.

FIG. 3 is an exploded perspective view of a second embodiment of the laminated electronic component of the present disclosure. In the second embodiment, instead of providing the electrode on the side surface, a conductor is embedded in the side surface with a surface partially exposed.

A magnetic material layer 31A is formed into a rectangular sheet shape and has a cutout formed in one of the longitudinal-direction side surfaces and a through-hole formed at a position corresponding to one end of a conductor pattern 32A described later. A conductor 33 having the same thickness as the magnetic material layer 31A is formed in the through-hole of the magnetic material layer 31A. A conductor 34A having the same thickness as the magnetic material layer 31A is formed in the cutout formed in the magnetic material layer 31A. The conductor 33 and the conductor 34A are formed by printing using the same material as the material forming the conductor pattern.

The magnetic material layer 31B is formed into a rectangular sheet shape and has a cutout formed in one of the longitudinal-direction side surfaces and a through-hole formed at a position corresponding to one end of the conductor pattern 32A described later. In the through-hole, a conductor having the same thickness as the magnetic material layer 31B is formed by printing using the same material as the material forming the conductor pattern 32A. The conductor pattern 32A is formed on the upper surface of the magnetic material layer 31B. This conductor pattern 32A is formed for less than one turn and has one end connected to the conductor 33 via the conductor in the through-hole formed in the magnetic material layer 31B. A conductor 34B having the same thickness as the magnetic material layer 31B is formed in the cutout formed in the magnetic material layer 31B. The conductor 34B is formed by printing using the same material as the conductor pattern 32A.

A magnetic material layer 31C is formed into a rectangular sheet shape and has a cutout formed in one of the longitudinal-direction side surfaces and a through-hole formed at a position corresponding to one end of a conductor pattern 32B described later. In the through-hole, a conductor having the same thickness as the magnetic material layer 31C is formed by printing using the same material as the material forming the conductor pattern 32B. The conductor pattern 32B is formed on the upper surface of the magnetic material layer 31C. This conductor pattern 32B is formed for less than one turn and has one end connected to the other end of the conductor pattern 32A via the conductor in the through-hole formed in the magnetic material layer 31C. A conductor 34C having the same thickness as the magnetic material layer 31C is formed in the cutout of the magnetic material layer 31C. The conductor 34C is formed by printing using the same material as the conductor pattern 32B.

A magnetic material layer 31D is formed into a rectangular sheet shape and has a cutout formed in one of the longitudinal-direction side surfaces and a through-hole formed at a position corresponding to one end of a conductor pattern 32C described later. In the through-hole, a conductor having the same thickness as the magnetic material layer 31D is formed by printing using the same material as the material forming the conductor pattern 32C. The conductor pattern 32C is formed on the upper surface of the magnetic material layer 31D. This conductor pattern 32C is formed for less than one turn and has one end connected to the other end of the conductor pattern 32B via the conductor in the through-hole formed in the magnetic material layer 31D. A conductor 34D having the same thickness as the magnetic material layer 31D is formed in the cutout of the magnetic material layer 31D. The conductor 34D is formed by printing using the same material as the conductor pattern 32C.

A magnetic material layer 31E is formed into a rectangular sheet shape and has a cutout formed in one of the longitudinal-direction side surfaces and a through-hole formed at a position corresponding to one end of a conductor pattern 32D described later. In the through-hole, a conductor having the same thickness as the magnetic material layer 31E is formed by printing using the same material as the material forming the conductor pattern 32D. The conductor pattern 32D is formed on the upper surface of the magnetic material layer 31E. This conductor pattern 32D is formed for less than one turn and has one end connected to the other end of the conductor pattern 32C via the conductor in the through-hole formed in the magnetic material layer 31E. A conductor 34E having the same thickness as the magnetic material layer 31E is formed in the cutout of the magnetic material layer 31E. The conductor 34E is formed by printing using the same material as the conductor pattern 32D.

A magnetic material layer 31F is formed into a rectangular sheet shape and has a cutout formed in one of the longitudinal-direction side surfaces and a through-hole formed at a position corresponding to one end of a conductor pattern 32E described later. In the through-hole, a conductor having the same thickness as the magnetic material layer 31F is formed by printing using the same material as the material forming the conductor pattern 32E. In the conductor pattern 32E less than one turn is formed on the upper surface of the magnetic material layer 31F. A conductor 34F having the same thickness as the magnetic material layer 31F is formed in the cutout of the magnetic material layer 31F. The conductor 34F is formed by printing using the same material as the conductor pattern 32E. The conductor pattern 32E has one end connected to the other end of the conductor pattern 32D via the conductor in the through-hole formed in the magnetic material layer 31F and the other end led out to the longitudinal-direction side surface of the magnetic material layer 31F.

A magnetic material layer 31G for protecting the conductor pattern is formed on the magnetic material layer 31F having the conductor pattern 32E formed thereon.

By spirally connecting the conductor patterns 32A to 32E between the magnetic material layers in this way, a coil pattern is formed in a laminated body. In this laminated body 30, a portion of a surface of a conductor connected to the lead-out end (the first end portion) of the coil pattern is exposed on the bottom surface, and the second end portion of the coil pattern is exposed on the longitudinal-direction side surface of the laminated body 30 together with a portion of a surface of a conductor connected to the second end portion and embedded in the longitudinal-direction side surface. In this case, the conductor extends in the lamination direction of the magnetic material layers between the bottom surface of the laminated body 30 and the second end portion. This laminated body 30 has a pair of external terminals, that is a first external terminal and a second external terminal, formed on the bottom surface, and the lead-out ends of the coil pattern are respectively connected via the conductors so that a coil is connected between the paired external terminals. Furthermore, the surface of the conductor embedded with the surface partially exposed on the longitudinal-direction side surface of the laminated body 30 is covered with an insulator film formed on the longitudinal-direction side surface of the laminated body 30. The insulator film is made of an insulating material, for example, a dielectric material such as glass and glass ceramics, a magnetic material such as ferrite, or a nonmagnetic material, and is particularly made of a material higher in volume resistivity and withstand voltage than the material constituting the laminated body.

Figure 4A:
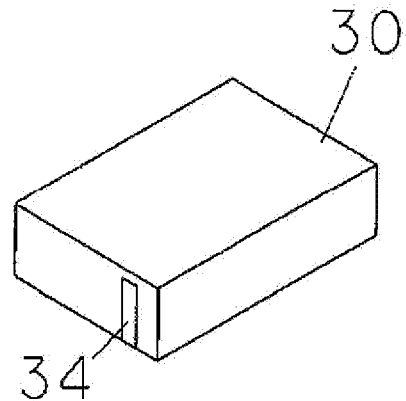
FIG. 4A is a perspective view for explaining a manufacturing method of the second embodiment of the laminated electronic component of the present disclosure.

The laminated electronic component as described above is manufactured as follows. First, the magnetic material layers and the conductor patterns are laminated and the conductor patterns between the magnetic material layers are spirally connected to form the laminated body having the coil formed therein. The coil has the first end portion led out to the bottom surface of the laminated body and the second end portion led out to a longitudinal-direction side surface of the laminated body and, as shown in FIG. 4A, the second end portion of the coil is led out to the bottom surface of the laminated body 30 via a conductor 34 having a surface partially exposed on the side surface of the laminated body.

Figure 4B:
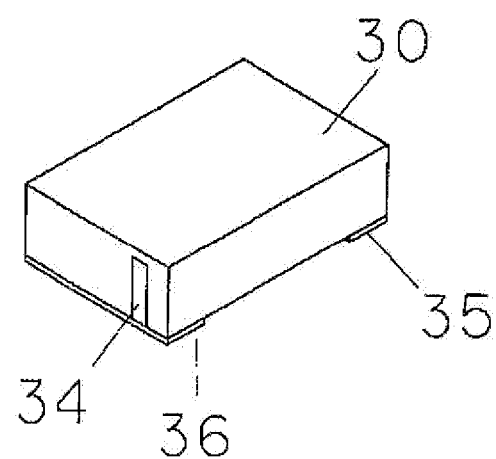
FIG. 4B is a perspective view for explaining a manufacturing method of the second embodiment of the laminated electronic component of the present disclosure.

As shown in FIG. 4B, a first external terminal 35 and a second external terminal 36 are then formed on the bottom surface of the laminated body 30, and the first end portion of the coil is connected via a conductor (not shown) to the first external terminal 35 while the second end portion of the coil is connected via the conductor 34 to the second external terminal 36 formed on the bottom surface of the laminated body.

Figure 4C:
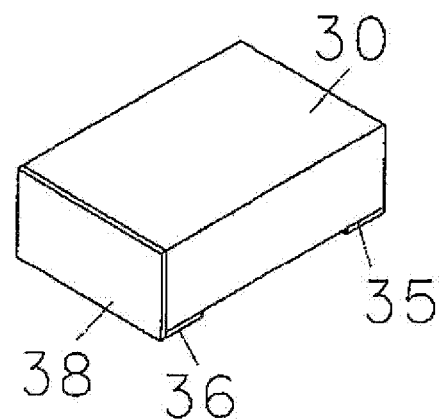
FIG. 4C is a perspective view for explaining a manufacturing method of the second embodiment of the laminated electronic component of the present disclosure.

Subsequently, as shown in FIG. 4C, an insulator film 38 is formed on the side surface of the laminated body 30 in the longitudinal direction of the laminated body of the coil so as to cover the conductor 34 connecting the second end portion and the second external terminal 36.

Figure 5:
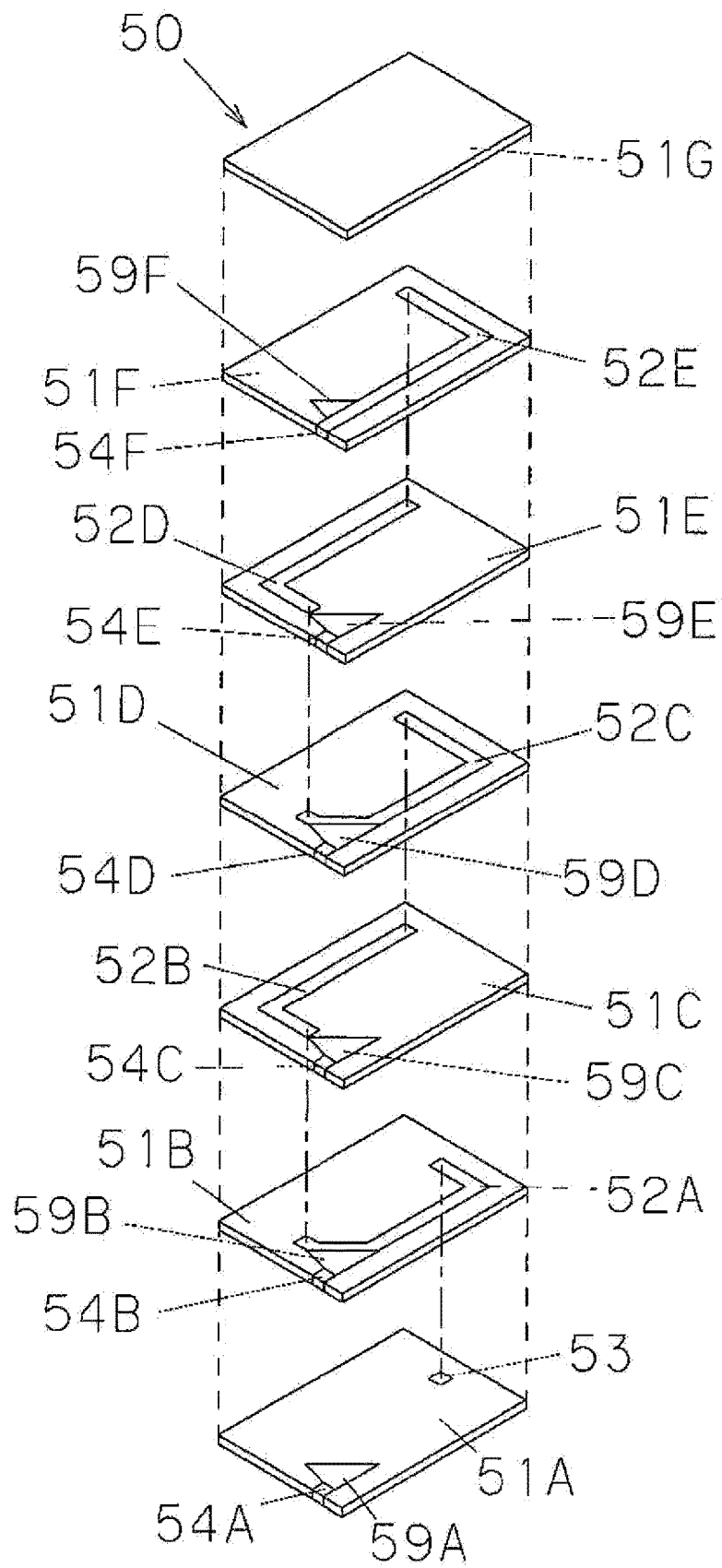
FIG. 5 is an exploded perspective view of a third embodiment of the laminated electronic component of the present disclosure.

FIG. 5 is an exploded perspective view of a third embodiment of the laminated electronic component of the present disclosure. In the third embodiment, an insulator part is disposed between a conductor disposed on a side surface and a coil.

A magnetic material layer 51A is formed into a rectangular sheet shape and has a cutout formed in one of the longitudinal-direction side surfaces, a first through-hole formed at a position corresponding to one end of a conductor pattern 52A described later, and a second through-hole formed between the cutout and a portion close to the cutout at a position corresponding to the conductor pattern 52A described later. A conductor 53 having the same thickness as the magnetic material layer 51A is formed in the first through-hole at the position corresponding to the one end of the conductor pattern of the magnetic material layer 51A. A conductor 54A having the same thickness as the magnetic material layer 51A is formed in the cutout formed in the magnetic material layer 51A. The conductor 53 and the conductor 54A are formed by printing using the same material as the material forming the conductor pattern. Additionally, an insulator part 59A is formed in the second through-hole formed between the cutout and the portion close to the cutout at the position corresponding to the conductor pattern. The insulator part 59A is made of an insulating material, for example, a dielectric material such as glass and glass ceramics, a magnetic material such as ferrite, or a nonmagnetic material, and is particularly made of a material higher in volume resistivity and withstand voltage than the material constituting the magnetic material layer 51A.

A magnetic material layer 51B is formed into a rectangular sheet shape and has a cutout formed in one of the longitudinal-direction side surfaces, a first through-hole formed at a position corresponding to one end of the conductor pattern 52A described later, and a second through-hole formed between the cutout and a portion of the conductor pattern 52A described later close to the cutout. In the cutout formed in the magnetic material layer 51B, a conductor 54B having the same thickness as the magnetic material layer 51B is formed by printing using the same material as the conductor pattern 52A. A conductor is also formed in the first through-hole in the same way. In the conductor pattern 52A less than one turn is formed on the upper surface of the magnetic material layer 51B and has one end connected to the conductor 53 via the conductor in the first through-hole formed in the magnetic material layer 51B. In the second through-hole formed between the cutout and the portion of the conductor pattern 52A close to the cutout, an insulator part 59B is formed having a thickness that is the sum of the thickness of the magnetic material layer 51B and the thickness of the conductor pattern 52A. The insulator part 59B is made of an insulating material, for example, a dielectric material such as glass and glass ceramics, a magnetic material such as ferrite, or a nonmagnetic material, and is particularly made of a material higher in volume resistivity and withstand voltage than the material constituting the magnetic material layer 51B.

A magnetic material layer 51C is formed into a rectangular sheet shape and has a cutout formed in one of the longitudinal-direction side surfaces, a first through-hole formed at a position corresponding to one end of a conductor pattern 52B described later, and a second through-hole formed between the cutout and a portion close to the cutout at a position corresponding to a conductor pattern 52C described later. In the cutout of the magnetic material layer 51C, a conductor 54C having the same thickness as the magnetic material layer 51C is formed by printing using the same material as the conductor pattern 52B. A conductor is also formed in the first through-hole in the same way. In the conductor pattern 52B less than one turn is formed on the upper surface of the magnetic material layer 51C and has one end connected to the other end of the conductor pattern 52A via the conductor in the first through-hole formed in the magnetic material layer 51C. In the second through-hole formed between the cutout and the portion close to the cutout at the position corresponding to the conductor pattern 52C, an insulator part 59C is formed having a thickness that is the sum of the thickness of the magnetic material layer 51C and the thickness of the conductor pattern 52B. The insulator part 59C is made of an insulating material, for example, a dielectric material such as glass and glass ceramics, a magnetic material such as ferrite, or a nonmagnetic material, and is particularly made of a material higher in volume resistivity and withstand voltage than the material constituting the magnetic material layer 51C.

A magnetic material layer 51D is formed into a rectangular sheet shape and has a cutout formed in one of the longitudinal-direction side surfaces, a first through-hole formed at a position corresponding to one end of the conductor pattern 52C described later, and a second through-hole formed between the cutout and a portion of the conductor pattern 52C described later close to the cutout. In the cutout of the magnetic material layer 51D, a conductor 54D having the same thickness as the magnetic material layer 51D is formed by printing using the same material as the conductor pattern 52C. A conductor is also formed in the first through-hole in the same way. In the conductor pattern 52C less than one turn is formed on the upper surface of the magnetic material layer 51D and has one end connected to the other end of the conductor pattern 52B via the conductor in the first through-hole formed in the magnetic material layer 51D. In the second through-hole formed between the cutout and the portion of the conductor pattern 52C close to the cutout, an insulator part 59D is formed having a thickness that is the sum of the thickness of the magnetic material layer 51D and the thickness of the conductor pattern 52C. The insulator part 59D is made of an insulating material, for example, a dielectric material such as glass and glass ceramics, a magnetic material such as ferrite, or a nonmagnetic material, and is particularly made of a material higher in volume resistivity and withstand voltage than the material constituting the magnetic material layer 51D.

A magnetic material layer 51E is formed into a rectangular sheet shape and has a cutout formed in one of the longitudinal-direction side surfaces, a first through-hole formed at a position corresponding to one end of a conductor pattern 52D described later, and a second through-hole formed between the cutout and a portion close to the cutout at a position corresponding to the conductor pattern 52C. In the cutout of the magnetic material layer 51E, a conductor 54E having the same thickness as the magnetic material layer 51E is formed by printing using the same material as the conductor pattern 52D. A conductor is also formed in the first through-hole in the same way. In the conductor pattern 52D less than one turn is formed on the upper surface of the magnetic material layer 51E and has one end connected to the other end of the conductor pattern 52C via the conductor in the first through-hole formed in the magnetic material layer 51E. In the second through-hole formed between the cutout and the portion close to the cutout at the position corresponding to the conductor pattern 52C, an insulator part 59E is formed having a thickness that is the sum of the thickness of the magnetic material layer 51E and the thickness of the conductor pattern 52D. The insulator part 59E is made of an insulating material, for example, a dielectric material such as glass and glass ceramics, a magnetic material such as ferrite, or a nonmagnetic material, and is particularly made of a material higher in volume resistivity and withstand voltage than the material constituting the magnetic material layer 51E.

A magnetic material layer 51F is formed into a rectangular sheet shape and has a cutout formed in one of the longitudinal-direction side surfaces, a first through-hole formed at a position corresponding to one end of a conductor pattern 52E described later, and a second through-hole formed between the cutout and a portion close to the cutout at a position corresponding to the conductor pattern 52C. In the cutout, a conductor 54F having the same thickness as the magnetic material layer 51F is formed by printing using the same material as the conductor pattern 52E described later. A conductor is also formed in the first through-hole in the same way. In the conductor pattern 52E less than one turn is formed on the upper surface of the magnetic material layer 51F and has one end connected to the other end of the conductor pattern 52D via the conductor in the first through-hole formed in the magnetic material layer 51F and the other end led out to a side surface of the magnetic material layer 51F perpendicular to the longitudinal direction and connected to the conductor 54F. In the second through-hole formed between the cutout and the portion close to the cutout at the position corresponding to the conductor pattern 52C, an insulator part 59F is formed having the same thickness as the thickness of the magnetic material layer 51F. The insulator part 59F is made of an insulating material, for example, a dielectric material such as glass and glass ceramics, a magnetic material such as ferrite, or a nonmagnetic material, and is particularly made of a material higher in volume resistivity and withstand voltage than the material constituting the magnetic material layer 51F.

A magnetic material layer 51G for protecting the conductor pattern is formed on the magnetic material layer 51F having the conductor pattern 52E formed thereon.

By spirally connecting the conductor patterns 52A to 52E between the magnetic material layers in this way, a coil pattern is formed in a laminated body. In this laminated body 50, a portion of a surface of a conductor connected to the lead-out end (the first end portion) of the coil pattern is exposed on the bottom surface, and the second end portion of the coil pattern is exposed on the longitudinal-direction side surface of the laminated body 50 together with a portion of a surface of a conductor connected to the second end portion and embedded in the longitudinal-direction side surface. In this case, the conductor extends in the lamination direction of the magnetic material layers between the bottom surface of the laminated body 50 and the second end portion. This laminated body 50 has a pair of external terminals that is the first external terminal and the second external terminal, formed on the bottom surface, and the lead-out ends of the coil pattern are respectively connected via the conductors so that a coil is connected between the paired external terminals. Furthermore, the surface of the conductor embedded with the surface partially exposed on the longitudinal-direction side surface of the laminated body 50 is covered with an insulator film formed on the longitudinal-direction side surface of the laminated body 50. The insulator film is made of an insulating material, for example, a dielectric material such as glass and glass ceramics, a magnetic material such as ferrite, or a nonmagnetic material, and is particularly made of a material higher in volume resistivity and withstand voltage than the material constituting the laminated body 50.

In this laminated body 50, an insulator part extending in the lamination direction of the magnetic material layers is formed between the conductor connected to the second end portion of the laminated body 50 and the coil pattern.

The laminated electronic component formed in this way has a core cross-sectional area of 0.37 mm$^2$, an inductance of 0.105 μH, a DC resistance value (Rdc) of 23.1 mΩ, and a rated current (Isat) of 7.1 A as the current value at −30% inductance relative to the inductance without a load when DC superimposition characteristics of an inductor are measured. Since the conventional laminated electronic component shown in FIGS. 6 and 7 has the values of 0.36 mm$^2$, 0.105 μH, 22.8 mil, and 6.9 A, respectively, and the conventional laminated electronic component shown in FIGS. 8 and 9 has the values of 0.35 mm$^2$, 0.104 μH, 22.6 mil, and 6.6 A, respectively, the laminated electronic component of the present disclosure has excellent DC superimposition characteristics and high insulation and withstand voltage characteristics as compared to the conventional components.

The inductance and the DC superimposition characteristics were measured by using LCR Meter 4285A, and the DC resistance value was measured by using Milliohm Meter 4338B.

Although the embodiments of the laminated electronic component of the present disclosure have been described, the present disclosure is not limited to the embodiments. For example, in the embodiments, the external terminals are formed on the bottom surface of the laminated body such that the terminals are visible from the side surfaces; however, the external terminals may be formed on the bottom surface of the laminated body away from the sides adjacent to the side surfaces such that the terminals are invisible from the side surfaces. In the first embodiment, an insulator part may be disposed between the electrode formed on the side surface of the laminated body to which the second end portion of the coil is led out and the coil pattern. In the first embodiment, the second end portion of the coil pattern may further be connected via a conductor to the second external terminal formed on the bottom surface of the laminated body.

In the second and third embodiments, an electrode may further be formed on the longitudinal-direction side surface of the laminated body to which the second end portion of the coil is led out.

It is to be understood that although the present disclosure has been described with regard to preferred embodiments thereof, various other embodiments and variants may occur to those skilled in the art, which are within the scope and spirit of the disclosure, and such other embodiments and variants are intended to be covered by the following claims.

All publications, patent applications, and technical standards mentioned in this specification are herein incorporated by reference to the same extent as if each individual publication, patent application, or technical standard was specifically and individually indicated to be incorporated by reference.

What is claimed is:

1. A laminated electronic component comprising
a coil, and
a laminated body, wherein
the coil is formed in the laminated body of pluralities of laminated magnetic material layers and conductor patterns by electrically connecting the conductor patterns adjacent to each other via the magnetic material layers, wherein
the magnetic material layers contain a metal magnetic material, wherein
the coil has a first end portion close to a bottom surface of the laminated body and a second end portion distant from the bottom surface of the laminated body, wherein
the first end portion is electrically connected to a first external terminal disposed on the bottom surface of the laminated body, wherein
the second end portion is electrically connected to a second external terminal disposed on the bottom surface of the laminated body via an electrode disposed on a side surface of the laminated body, the side surface along which the electrode extends is an outermost side surface of the laminated body, wherein
the electrode is covered with an insulator film, and wherein
a distalmost edge of the first end portion of the coil is spaced from an other outermost side surface of the laminated body which is opposite to the outermost side surface of the laminated body along which the electrode extends.

2. The laminated electronic component according to claim 1, wherein
the laminated body has a top surface opposite to the bottom surface; and
the electrode has a first end that contacts the second external terminal and a second end opposite to the first end, the second end being at a position along the side surface of the laminated body such that a space exists between the top surface and the second end.

3. The laminated electronic component according to claim 2, wherein
a portion of the insulator film extends into the space.

4. The laminated electronic component according to claim 3, wherein
the portion of the insulator film that extends into the space covers the second end of the electrode.

5. The laminated electronic component according to claim 3, wherein
the portion of the insulator film that extends into the space contacts the side surface of the laminated body.

6. The laminated electronic component according to claim 3, wherein
the portion of the insulator film that extends into the space covers the second end of the electrode and contacts the side surface of the laminated body.

7. The laminated electronic component according to claim 1, wherein
the insulator film includes a dielectric material.

8. The laminated electronic component according to claim 7, wherein
the dielectric material includes at least one of glass and a glass ceramic.

9. The laminated electronic component according to claim 1, wherein
the insulator film includes a magnetic material.

10. The laminated electronic component according to claim 9, wherein
the magnetic material includes ferrite.

11. The laminated electronic component according to claim 1, wherein
the insulator film includes a nonmagnetic material.

12. The laminated electronic component according to claim 1, wherein
the insulator film includes a dielectric material and one of a magnetic material and a nonmagnetic material.

13. The laminated electronic component according to claim 12, wherein
the dielectric material includes at least one of glass and a glass ceramic; and
the magnetic material includes ferrite.

14. The laminated electronic component according to claim 1, wherein
the insulator film includes a material having a higher volume resistivity and withstand voltage than a material of the laminated body.

* * * * *